(12) United States Patent
Luan et al.

(10) Patent No.: US 9,344,070 B2
(45) Date of Patent: May 17, 2016

(54) RELAXATION OSCILLATOR WITH LOW DRIFT AND NATIVE OFFSET CANCELLATION

(71) Applicant: Texas Instruments Incorporated, Dallas, TX (US)

(72) Inventors: Jiyuan Luan, Fremont, CA (US); Michael J. DiVita, Morgan Hill, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/583,138

(22) Filed: Dec. 25, 2014

(65) Prior Publication Data

US 2015/0214934 A1    Jul. 30, 2015

Related U.S. Application Data

(60) Provisional application No. 61/932,026, filed on Jan. 27, 2014.

(51) Int. Cl.
*H03K 3/0231* (2006.01)
*H03K 4/50* (2006.01)
*H03K 5/003* (2006.01)
*H03K 3/011* (2006.01)

(52) U.S. Cl.
CPC ............... *H03K 4/50* (2013.01); *H03K 3/011* (2013.01); *H03K 3/0231* (2013.01); *H03K 5/003* (2013.01)

(58) Field of Classification Search
CPC .................. H03K 3/0231; H03K 4/50–4/502; H03B 5/20; H03B 5/24
USPC ................................................. 331/111, 143
See application file for complete search history.

(56) References Cited

U.S. PATENT DOCUMENTS

| | | |
|---|---|---|
| 1,921,476 A | 8/1933 | Page |
| 3,320,434 A | 5/1967 | Ott |
| 3,873,853 A | 3/1975 | Ahmed |
| 3,906,353 A | 9/1975 | Murdock |
| 4,260,959 A | 4/1981 | Allgood |
| 4,413,238 A | 11/1983 | Pace |
| 4,607,238 A | 8/1986 | Kohsiek |

(Continued)

FOREIGN PATENT DOCUMENTS

| | | | |
|---|---|---|---|
| JP | 07-086833 A | * 3/1995 | ............... H03B 5/20 |
| RU | 63997 | 6/2007 | |

OTHER PUBLICATIONS

Barnett et al., A 0.8V 1.52MHz MSVC Relaxation Oscillator with Inverted Mirror Feedback Reference for UHF RFID, IEEE 2006, Custom Integrated Circuits Conference (CICC), pp. 769-772.
Choe et al., A Precision Relaxation Oscillator With a Self-Clocked Offset-Cancellation Scheme for Implantable Biomedical SoCs, IEEE 2009 Int'l Solid-State Circuits Conference, Session 23/PLLs and Clocks/23.7, 3 pgs.
Analog Devices, Ultralow Noise, High Accuracy Voltage References, Data Sheet ADR4520/ADR4525/ADR4530/ADR4533/ADR4540/ADR4550, 2012, 32 pgs.
PCT Search Report dated mailed Apr. 29, 2015.
RU63997, English Machine Translation (5 pages).

*Primary Examiner* — Ryan Johnson
(74) *Attorney, Agent, or Firm* — William B. Kempler; Frank D. Cimino

(57) ABSTRACT

Relaxation oscillator circuitry is presented with low drift and native offset cancellation, including an amplifier amplifying a first current signal to provide a pulse amplifier output waveform, an integrator integrating a second current signal to provide a ramp output waveform, and a comparator comparing the integrator output waveform with a threshold set by the amplifier output waveform to generate an alternating oscillator output used to switch the polarities of the first and second current signals.

20 Claims, 7 Drawing Sheets

(56) References Cited

U.S. PATENT DOCUMENTS

| | | |
|---|---|---|
| 5,565,819 A | 10/1996 | Cooper |
| 5,594,388 A | 1/1997 | O'Shaughnessy et al. |
| 6,020,792 A | 2/2000 | Nolan et al. |
| 6,326,859 B1 * | 12/2001 | Goldman ............... H03K 3/011 331/111 |
| 6,356,161 B1 | 3/2002 | Nolan et al. |
| 6,614,313 B2 | 9/2003 | Crofts et al. |
| 6,924,709 B2 | 8/2005 | Bashar |
| 7,109,804 B2 | 9/2006 | Mader et al. |
| 7,746,130 B2 * | 6/2010 | Chang ................... H03F 3/2173 327/131 |
| 8,766,731 B2 * | 7/2014 | Kamp ................... H03B 27/00 331/143 |
| 2012/0126906 A1 | 5/2012 | Choe et al. |
| 2013/0088301 A1 | 4/2013 | Kamp et al. |

* cited by examiner

RELAXATION OSCILLATOR WITH LOW DRIFT AND NATIVE OFFSET CANCELLATION

REFERENCE TO RELATED APPLICATION

This application claims priority to, and the benefit of, U.S. Provisional Patent Application Ser. No. 61/932,026, filed on Jan. 27, 2014, entitled DRIFT RESISTANT RELAXATION OSCILLATOR WITH NATIVE OFFSET CANCELLATION, the entirety of which application is hereby incorporated by reference.

BACKGROUND

Relaxation oscillator circuits are used to provide clock signals for applications in which a precise output signal frequency is desired. Many relaxation oscillators operate by charging and discharging reactive components and comparing the charged state variable with a preset threshold to provide for state switching of a bi-stable output defining a clock cycle. Such circuitry, however, is subject to long-term drift in the output frequency caused by drift of a bandgap or other reference circuit providing the threshold for comparator switching. Moreover, such circuits often suffer from output frequency drift caused by amplifier gain degradation over time and temperature, as well as comparator offset drift effects and power supply variation.

SUMMARY

Relaxation oscillator circuitry is presented with low drift and native offset cancellation, including an amplifier amplifying a first current signal to provide a pulse amplifier output waveform, an integrator integrating a second current signal to provide a ramp output waveform, and a comparator comparing the integrator output waveform with a threshold set by the amplifier output waveform to generate an alternating oscillator output used to switch the polarities of the first and second current signals. The current signals are generated based on a single input current for matching, with the first and second signals being of generally equal amplitudes and alternating polarities to facilitate native offset cancellation to mitigate oscillator output frequency drift over time and/or supply voltage variations. Moreover, the amplifier and integrator circuits are connected to the same bias node, with the alternate polarity switching of the current signals and current source matching providing native cancellation of offsets using the oscillator's own switching without introduction of additional oscillators or other circuitry. The oscillator circuit configuration facilitates the use of resistive divider or other bias voltage circuitry without the cost of high accuracy bandgap circuits and the like. The use of current mirror circuitry in certain embodiments facilitates generation of the switched current signals based on a single input current signal, with the current matching being provided by ratiometric circuit design independent of power supply levels for improved power supply rejection ratio (PSRR). In addition, the output frequency is determined using passive resistive and capacitive components without amplifier offset voltage drift or other active component drift effects. Thus, the ratiometric scaling cancels offset voltage and amplifier gain degradation effects over time while maintaining low power consumption and small die size ideal for fully integrated precision oscillators.

Oscillator circuitry is provided including a first amplifier with a feedback resistance for amplifying a first current signal, as well as an integrator circuit with a second amplifier and a feedback capacitance for integrating a second current signal, along with a comparator providing an oscillator output signal alternating between first and second levels based on comparison of the amplifier and integrator outputs. The first and second amplifiers have inputs coupled to a single bias voltage, with input offset effects of the individual amplifier circuits being canceled by the switching operation of the oscillator circuit. A switchable current source circuit provides the first and second current signals of generally equal amplitudes or levels, and alternates the polarities of the current signals based on transitions of the oscillator output signal from the comparator for self-oscillation. The switchable current source circuit may include first and second current sources provided by current mirror circuitry to source first and second currents of a first current value to the first and second amplifiers, as well as further current mirror circuitry to provide third and fourth current sources sinking third and fourth currents of twice the first current value, with switching circuitry configured to selectively connect the third and fourth current sources to the inputs of the first and second amplifiers to effectively reverse the polarity of the currents provided to the amplifier and integrator circuits. This creates a pulse output waveform from the amplifier circuit and a ramp waveform output from the integrator circuit for comparison by the comparator to toggle the oscillator output signal and alternate the state of the switching circuitry.

DESCRIPTION OF THE VIEWS OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
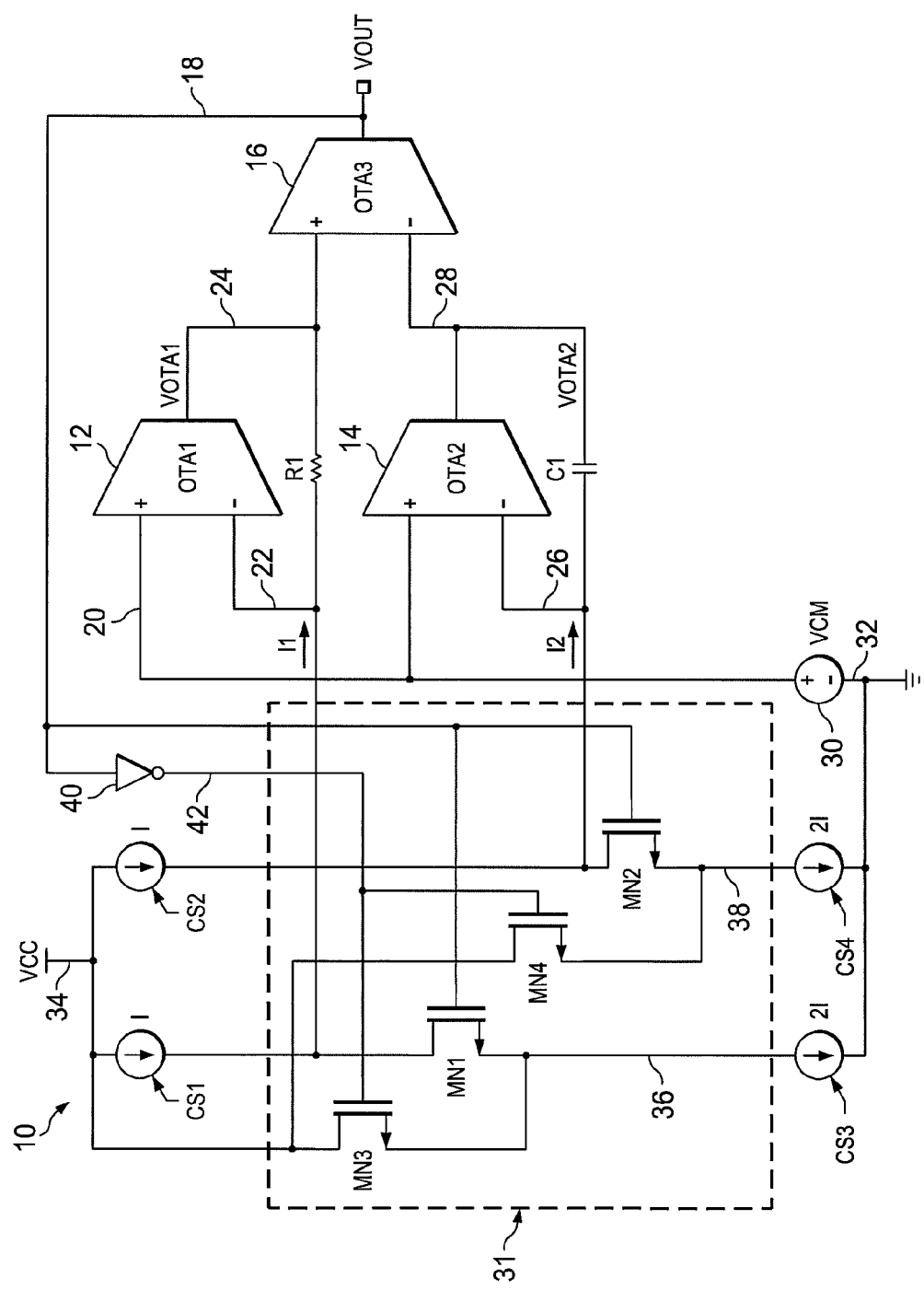
FIG. 1 is a schematic diagram illustrating a relaxation oscillator circuit embodiment with amplifier, integrator and comparator circuits using operational transconductance amplifiers, matched current sources and a switching circuit for generating an alternating oscillator output signal.

One or more embodiments or implementations are hereinafter described in conjunction with the drawings, wherein like reference numerals are used to refer to like elements.

Figure 7:
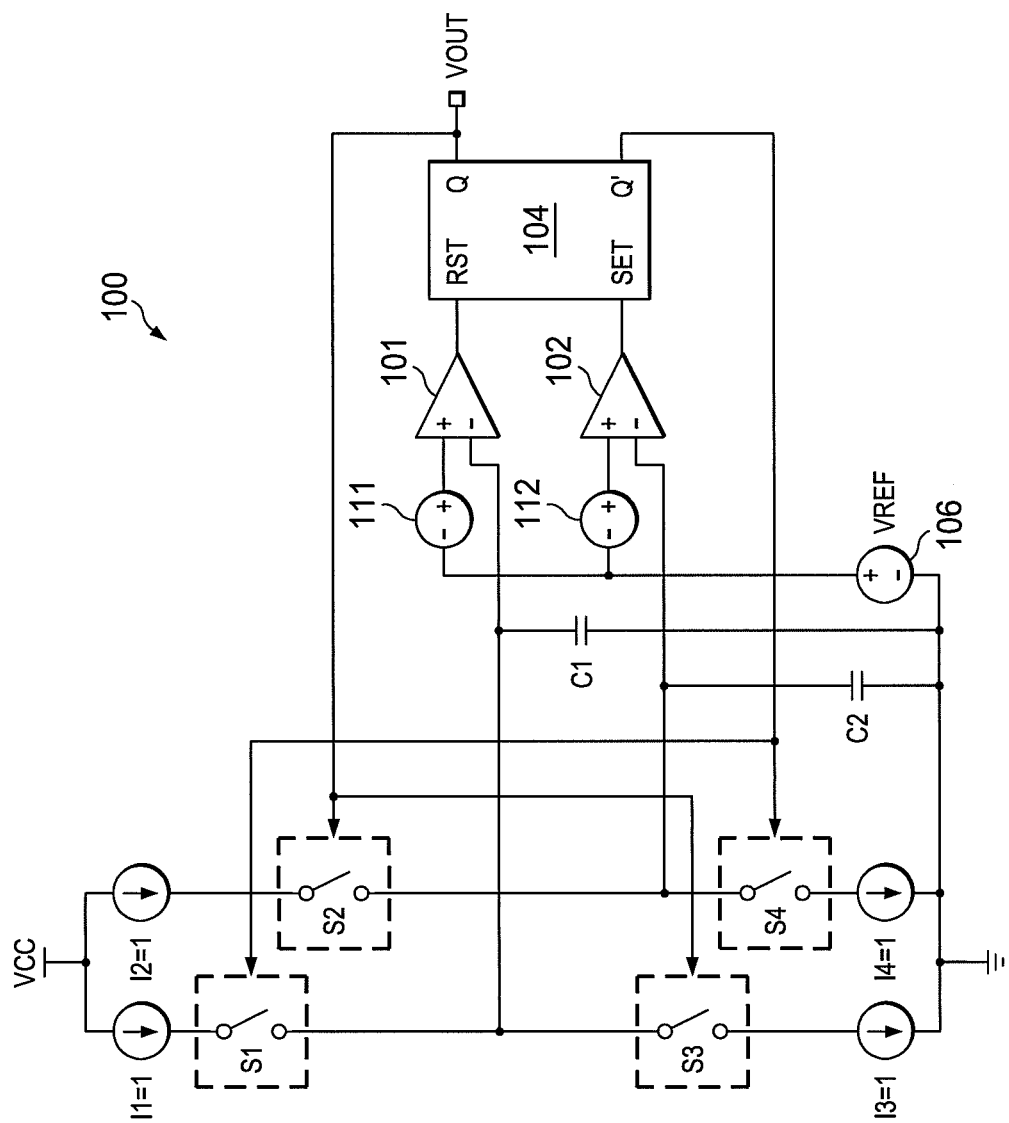
FIG. 7 is a schematic diagram showing a relaxation oscillator circuit using a precision reference voltage.

Referring initially to FIG. 7, a relaxation oscillator circuit 100 is shown for generating an oscillating output voltage VOUT. The oscillator 100 includes a pair of operational transconductance amplifier (OTA) comparators 101 and 102 comparing charging voltages of corresponding first and second capacitors C1 and C2 with a precision reference voltage threshold (VREF) from a precision reference source 106, such as a bandgap voltage reference circuit, in order to provide reset (RST) and set (SET) inputs to an RS flip-flop 104. FIG. 7 further illustrates input offset voltages 111 and 112 associated with the comparators 101 and 102, respectively. The Q output of the flip-flop 104 provides the oscillator output voltage VOUT, and the primary and inverse flip-flop outputs Q and Q' are used to operate a set of switches S1, S2, S3 and S4 to control the charging and discharging of the capacitors C1 and C2 by selective connection of current sources I1, I2, I3 and I4 in order to provide a closed loop self-oscillating circuit. In this circuit 100, the non-inverting comparator inputs are offset from the precision reference voltage VREF by the respective voltage offsets 111 and 112. The inverting input of the first comparator 101 is alternately connected to current source I1 or I3 by alternating operation of switches S1 and S3, and the inverting input of the second comparator 102 is alternately connected to either I2 or I4 via switches S2 and S4. As shown, moreover, the switches S1 and S4 are operated concurrently by the Q' output from the flip-flop 104, and switches S2 and S3 are operated according to the Q output. In this manner, a self-oscillating circuit is provided with an operating frequency determined according to the values of the current sources (I in this example), the capacitances of C1 and C2, as well as the supply voltage VCC, the reference voltage VREF and the offset voltages 111 and 112. In particular, the duration Tosc of each cycle of the oscillator circuit 100 is described by the following equation (1):

$$Tosc = C/I*[2(VCC-VREF)+Voffset1+Voffset2] \quad (1)$$

As seen in the above equation (1), the oscillator circuit 100 is sensitive with respect to both the supply voltage level VCC, as well as to the reference voltage VREF and the offset voltages 111 and 112. Moreover, the inventors have appreciated that the oscillator 100 is susceptible to oscillator frequency variation caused by long-term drift in various components of the circuit. For example, both the offset voltages 111 and 112 and the reference voltage 106 will tend to drift over time due to various aging mechanisms, where these drift effects are generally random. In this regard, standalone bandgap reference circuits 106 may drift by as much a 0.5% in the initial six weeks of operation. Thus, the precision threshold reference provided by the bandgap circuit 106 to the inverting inputs of the comparators 101 and 102 will drift or vary with time, and therefore the circuit 100 of FIG. 7 is subject to potentially significant oscillator frequency variation or drift over time. In addition, drift effects in the comparator offset voltages 111 and 112 will also affect the charging and discharging of the capacitors C1 and C2, potentially causing asymmetry in the output waveform. While the drift effects on the accuracy and stability of the oscillator 100 of FIG. 7 can be addressed in some measure by the use of a precision reference 106, this increases product cost and does not immunize the circuit from long-term drift effects. This long-term frequency drift posts a challenge for using this type of relaxation oscillator design in applications such as inductive-coupled power and signal transmission circuits for implanted electronic devices, due to their expected long service time and high risk of replacement once in service.

Figure 2:
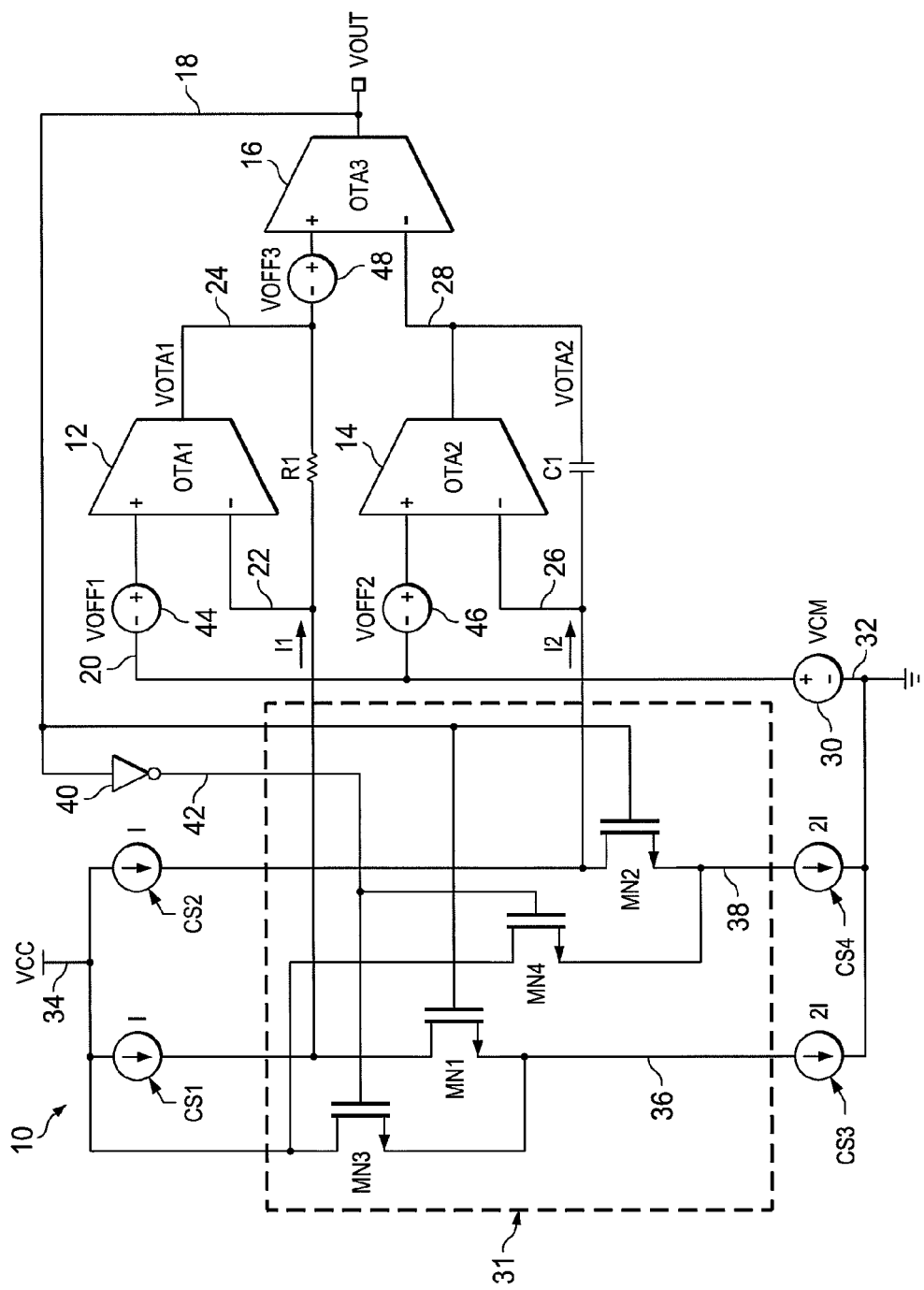
FIG. 2 is a schematic diagram illustrating the oscillator circuit of FIG. 1 showing input offset voltages of the transconductance amplifiers.

Referring now to FIGS. 1 and 2, FIG. 1 shows a relaxation oscillator circuit embodiment 10 using operational transconductance amplifiers 12, 14 and 16 (OTAs), and FIG. 2 further schematically shows the internal offset voltages 44, 46 and 48 of the OTA components of the oscillator 10. Although illustrated in certain embodiments using OTAs, other forms of amplifiers can be used for one, some or all of the components 12, 14 and 16, such as voltage amplifiers, voltage comparators, etc. The illustrated oscillator circuit embodiment 10 includes a first amplifier circuit formed by the first amplifier 12 (OTA1) and a resistor R1 connected in a feedback path of the amplifier 12 to form an inverting amplifier configuration. This first amplifier circuit 12, R1 receives and amplifies a first current signal I1 received at the inverting input (−) of the first amplifier 12 via a first circuit node 22 to provide a first amplifier output signal VOTA1 at the amplifier output node 24. The resistance R1 can be a single resistor component, such as formed in an integrated circuit implementing the oscillator 10, or two or more resistors can be connected in any suitable series and/or parallel configuration to provide a resistance R1 coupled directly or indirectly between the amplifier output node 24 and the first node 22. Moreover, the resistance R1 may be trimmable or otherwise adjustable in certain embodiments. The non-inverting (+) input of the first amplifier 12 is coupled with (e.g., connected to) a bias node 20 whose voltage is established by a bias voltage source 30 (VCM) coupled between the bias node 20 and a ground or other constant voltage node 32.

The oscillator circuit 10 further includes an integrator circuit formed by a second amplifier 14 (e.g., OTA 2) with a non-inverting input coupled with the bias node 20 and an inverting input coupled with a second circuit node 26, along with a feedback capacitance C1 coupled between the second node 26 and a second amplifier output node 28 to form an inverting integrator circuit. The capacitance C1 can be any suitable configuration of one or more capacitors in suitable series and/or parallel interconnections to provide the capacitance C1. In addition, the capacitance C1 can be trimmable or adjustable in certain embodiments. In operation, the integrator circuit 14, C1 receives and integrates a second current signal I2 received at the second node 26 to provide an integrator output signal VOTA2 as a ramp waveform at the output node 28.

The third amplifier 16 (OTA3) is used as a comparator having a first (+) input receiving the first amplifier output signal VOTA1 at the node 24, as well as a second (−) input coupled to the node 28 to receive the second amplifier output signal VOTA2. The comparator 16 includes an output coupled with an output node 18 providing an oscillator output signal VOUT. In particular, the oscillator output signal at node 18 is at a first level (e.g., low in this example) when the first amplifier output at node 24 is less than the second amplifier output at node 28, and the output signal VOUT is at a different second level (e.g., high) when the output of the first amplifier at node 24 is greater than the second amplifier output at node 28.

The oscillator output signal VOUT is provided as a switching control signal to a switching circuit 31 including transistors MN1, MN2, MN3 and MN4 which operates in a first state when the oscillator output signal VOUT at node 18 is the first level (e.g., low), and in a second state when VOUT is at the second level (e.g., high). While illustrated as using N-channel MOSFET switches MN1, MN2, MN3 and MN4, other types and configurations of switches can be used in different embodiments. The switching circuit 31 and four matched current sources CS1, CS2, CS3 and CS4 together provide a switchable current source circuit operative in the first state to source a positive first current signal I1 to the first circuit node 22 having a first current value indicated in the drawings as "I", and to also source a positive second current signal I2 of the same value I to the second node 26. When the switching circuit 31 is instead in the second state according to the output signal VOUT (e.g., when VOUT is high in this example), the switchable current source circuit sinks a negative first current signal I1 having a value I from the node 22 and also sinks a negative second current signal I2 having a value I from the second node 26.

As discussed further below, the first and second current sources CS1 and CS2 are matched to one another to provide substantially equal currents of value I to the first and second nodes 22 and 26, respectively, and likewise the third and fourth current sources CS3 and CS4 are matched to one another to sink generally equal currents of value 2I from the respective first and second nodes 22 and 26 when connected by the switching circuit 31 in the second state. Moreover, operation of the switching circuit 31 according to the state of the output signal VOUT causes the oscillator circuit 10 to be self-oscillating. As a result, the first amplifier 12 amplifies the alternatively sourcing and sinking current signal I1 from the first node 22 to provide the first amplifier output signal VOTA1 as a pulse waveform having alternating first and second levels as the voltage across the resistance R1 transitions above and below the bias voltage level VCM at the bias node 20. Moreover, the integrator amplifier 14 integrates the second current signal I2 to provide the second amplifier output signal VOTA2 as a ramp waveform having alternating negative and positive slopes. This, in turn, causes the comparator amplifier 16 to provide an alternating output having a low level when the ramp waveform from the integrator amplifier 14 is greater than the pulse waveform from the first amplifier 12 and vice versa.

As the integrator signal waveform VOTA2 has a rise time and fall time dictated largely by the amplitude of the current signal I2 and the capacitance of C1, and since the pulse waveform VOTA1 has an amplitude dictated primarily by the current signal I1 and the resistance R1, the oscillating frequency of the circuit 10 is primarily determined by the passive components R1 and C1. Moreover, since the current sources CS1-CS4 are matched with respect to one another, the operating frequency of the oscillator circuit 10 is largely independent of the supply voltage VCC. Furthermore, unlike the oscillator 100 of FIG. 7, the oscillator 10 in FIGS. 1 and 2 has an operating oscillator frequency independent of the offset voltages 44, 46 and 48 of the amplifiers 12, 14 and 16, and is largely immune to offset-based drift and OTA gain drift effects over time. In particular, as seen in FIG. 2, the offset voltages 44 (VOFF1), 46 (VOFF2) and 48 (VOFF3) associated with the OTAs 12, 14 and 16 do not affect the oscillating frequency at the output node 18. In addition, introducing a local reference voltage which is generated from a copy of the charging and discharging currents of C1, the geometric matching of the current signals I1 and I2 yields an operating frequency primarily determined by the physical dimensions of the passive components R1 and C1, thereby mitigating or avoiding any frequency drift due to performance (e.g., gain "gm") degeneration or drift of the amplifiers 12, 14 and 16.

Figure 6:
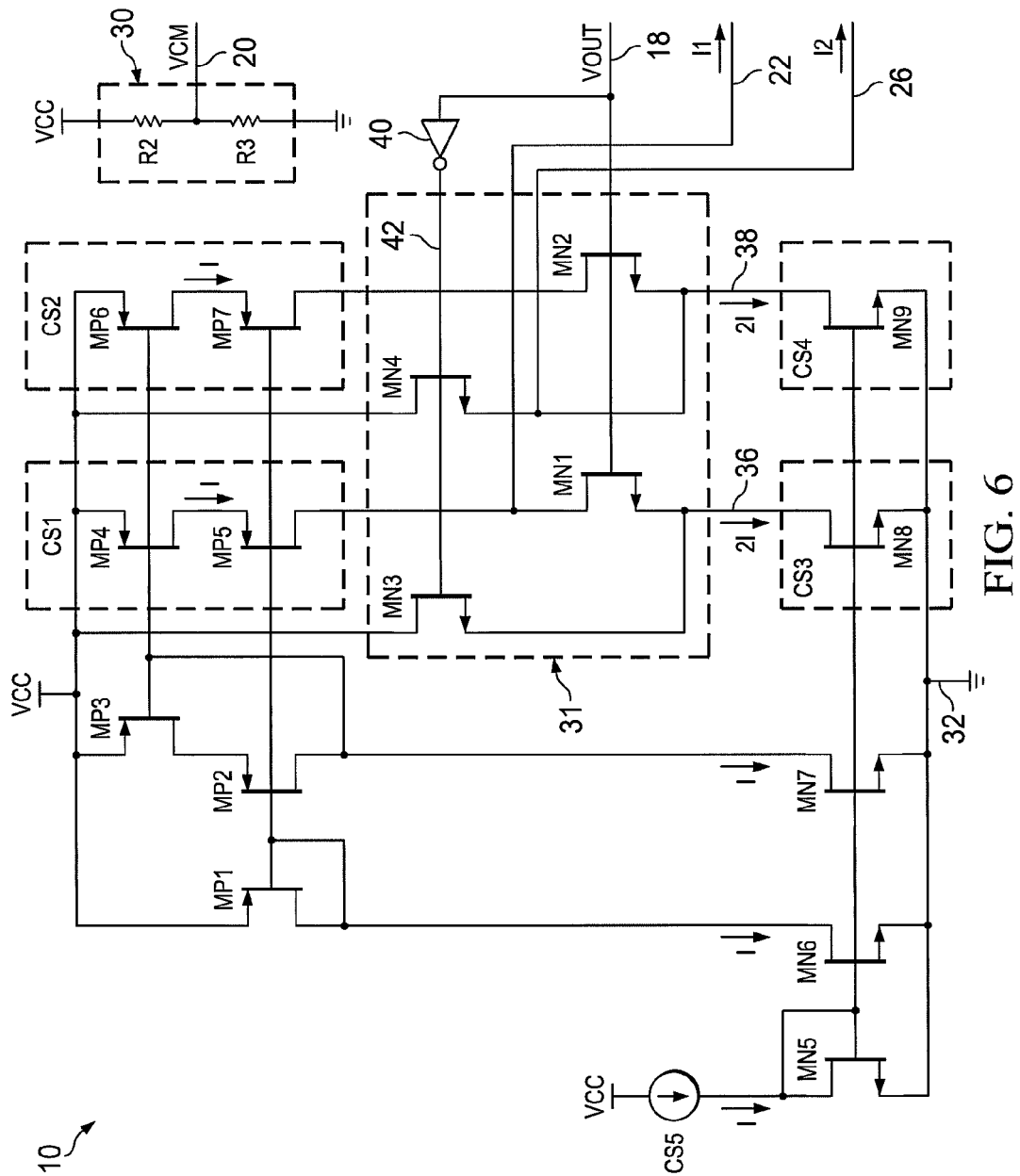
FIG. 6 is a schematic diagram illustrating a switchable current source circuit embodiment providing matched first and second current signals of alternating polarity according to the oscillator output signal using current mirror circuitry based on a single input current signal.

Moreover, this drift immunity advantageously allows the use of a low-cost bias voltage source 30, which can be implemented in certain embodiments as a simple resistive divider circuit providing the voltage VCM to the bias node 20 based on the supply voltage VCC, as seen in FIG. 6 below. Thus, the cost and complexity of a bandgap or other precision reference voltage can be avoided without sacrificing stable and accurate oscillator circuit performance. The oscillator circuitry 10, moreover, can be fabricated in any suitable CMOS process and can be easily integrated with other circuits in an IC with minimal cost and complexity, and provides enhanced frequency stability over supply voltage variation (good power supply rejection ratio PSRR) for long-term frequency stability. In one non-limiting example, for instance, the passive components R1 and C1 can be fabricated using low temperature coefficient fabrication processing steps, with the resistor R1 being formed for a designed value of 21.8 kΩ, and the capacitance C1 is provided as a trimmable capacitor bank with an untrimmed value of 92 pF for a ratio 1/4R1C1 to yield an oscillating frequency of approximately 1.25 MHz, which can be trimmed to 1 MHz. In one embodiment, moreover, the value for the current "I" is 10 µA as a designed value. However, it will be appreciated that the matching of the current sources CS1-CS4 and the offset canceling circuit configuration means that the oscillator frequency will be independent of the absolute value of the current "I".

Figure 3:
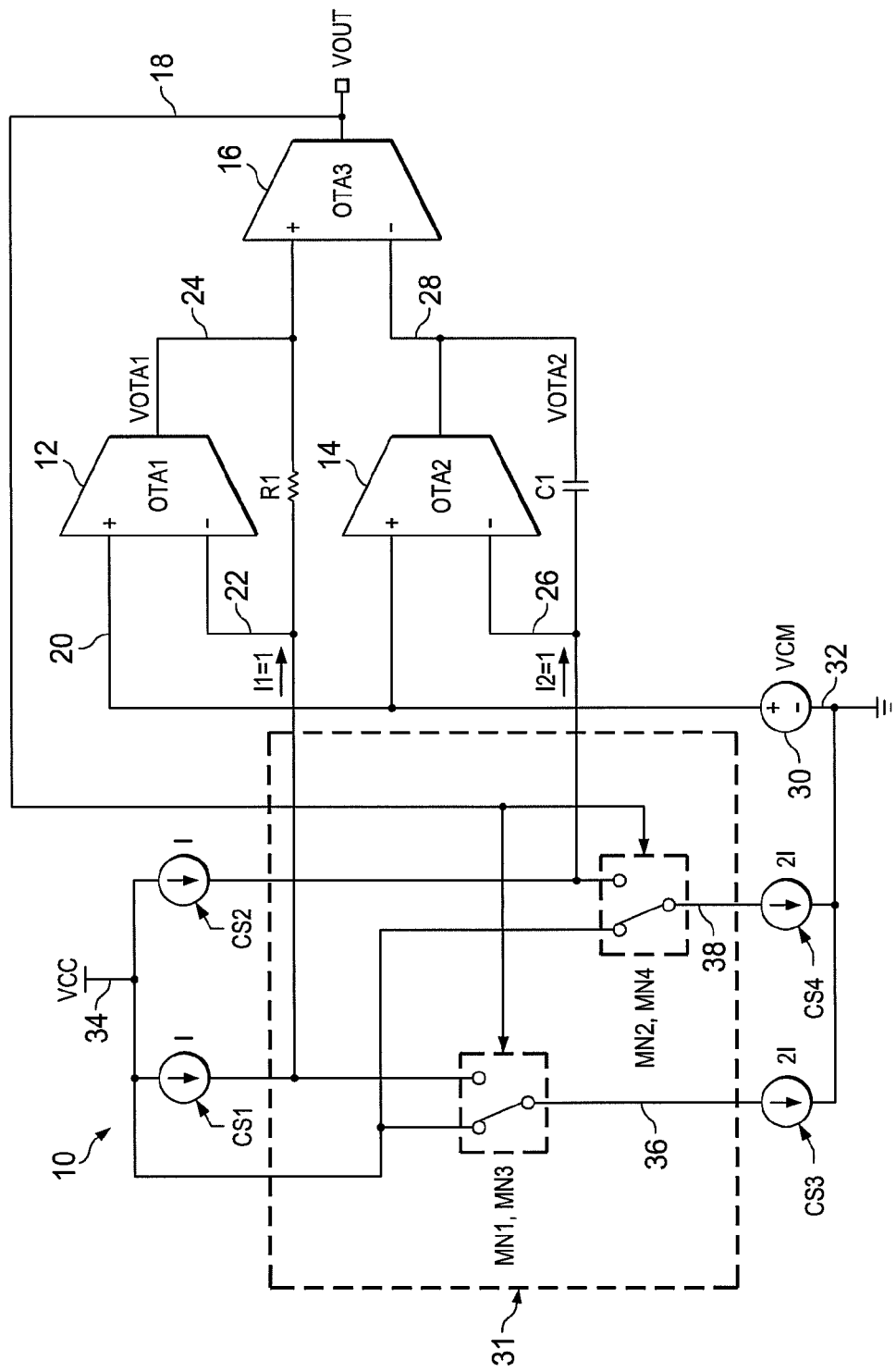
FIG. 3 is a schematic diagram showing operation of the oscillator circuit of FIGS. 1 and 2 in a first state with the current sources and switching circuit sourcing equal positive current signals to the amplifier and integrator to charge an integrator capacitor to provide a decreasing ramp signal and a low threshold signal as inputs to the comparator.
Figure 4:
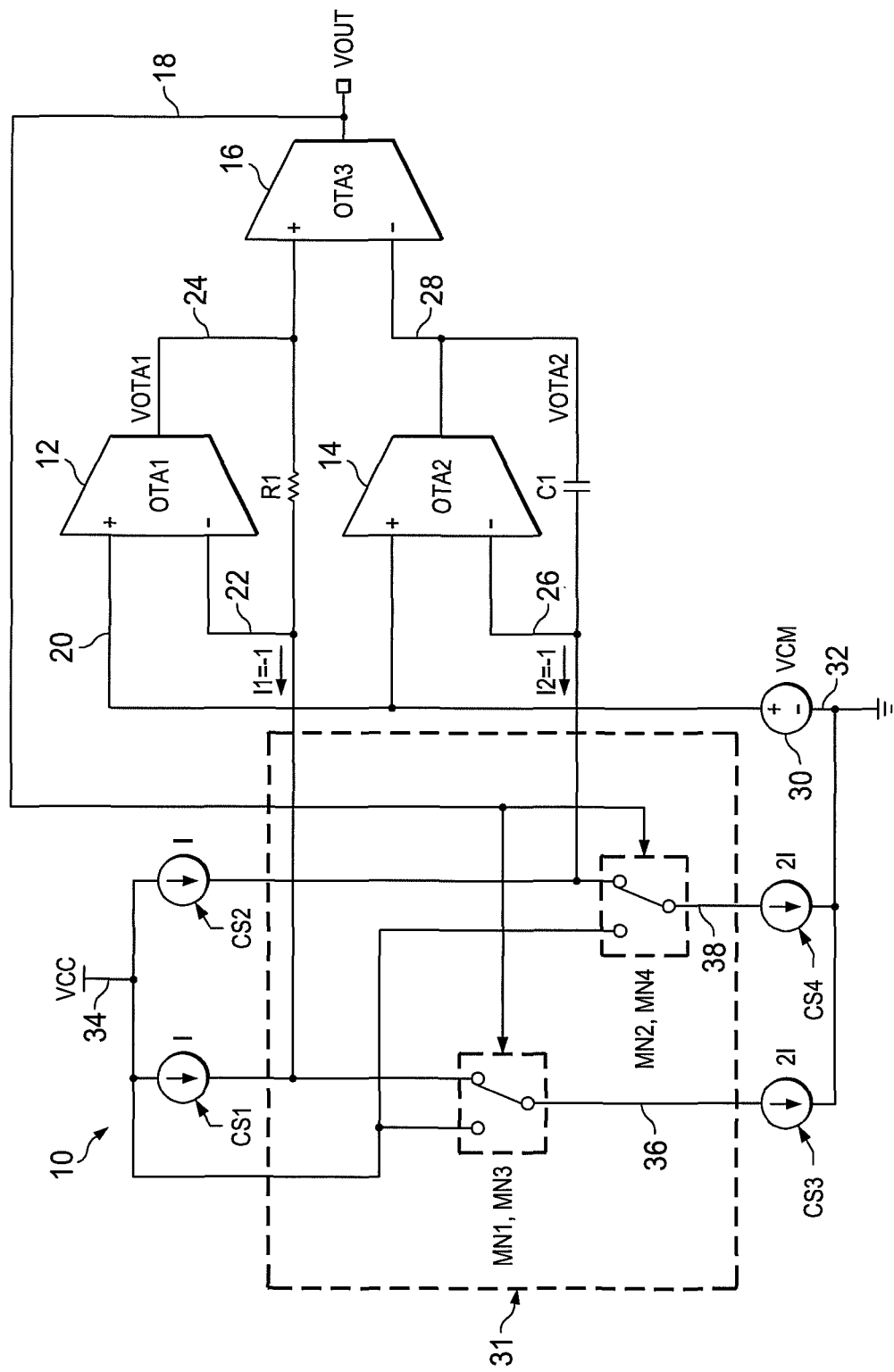
FIG. 4 is a schematic diagram showing operation of the oscillator circuit of FIGS. 1-3 in a second state with the current sources and switching circuit sinking equal negative current signals from the amplifier and integrator to discharge the capacitor to provide an increasing ramp signal and a high threshold signal as comparator inputs.

Referring also to FIGS. 3-6, the switching circuit 31 can be fabricated using any suitable form of switching devices, where the illustrated circuit transistors MN1-MN4 are N-channel MOSFET transistors. As shown in FIGS. 3 and 4, the transistors MN1 and MN3 are used to selectively couple the current source CS3 with the first circuit node 22 or with the supply voltage node 34 (VCC), and the transistors MN2 and MN4 operate to selectively couple the current source CS4 with the second circuit node 26 or with the supply node 34. The switching transistors MN1 and MN2 in this example are operated according to the signal VOUT from the node 18, while the transistors MN3 and MN4 are operated according to the inverse of VOUT provided on a circuit node 42 from the output of an inverter 40 (FIGS. 1 and 2). In this manner, the switches MN1 and MN3 effectively provide a single pole double throw switch, as do the transistors MN2 and MN4 as schematically shown in FIGS. 3 and 4.

FIGS. 3 and 4 illustrate operation of the oscillator circuit 10 in the two output states, where FIG. 3 illustrates the switching circuit 31 in the first state for a low output voltage VOUT at the node 18. In this condition, a positive first current signal I1=I is provided from the source CS1 to the first node 22 (left to right in the drawing), and the lower current source CS3 conducts its current of a value 2I from VCC through a third circuit node 36 to the constant voltage node 32 (e.g., ground). The inverting amplifier 12 amplifies the first current signal I1 to provide a low output voltage at the node 24 as a first input to the comparator 16. The switching circuit 31 in this state also connects CS2 to provide a positive second current signal I2=I (left to right in the drawing) to the second node 26 to charge the capacitance C1 while connecting the fourth current source CS4 to conduct its current (2I) from VCC through a fourth circuit node 38 to ground 32. In this first state, moreover, the integrator circuit 14, C1 (inverting integrator configuration) integrates the current signal I2 from CS2 in order to provide a downward-sloped ramp signal to the second input of the comparator 16 at node 28. The comparator 16 in the illustrated first state provides a low voltage VOUT at the output node 18 until the downward ramp signal VOTA2 decreases below the low output level of VOTA1.

As shown in FIG. 4, when that transition occurs, the output voltage at node 18 goes high causing the switching circuit 31 to enter the second state. In this condition, the switching circuit 31 connects the third node 36 with the first node 22, with CS3 conducting 2I from the node 22 to the ground node 32 while CS1 conducts I from the supply node 34 to the first node 22, yielding a sinking first current signal I1=−I (right to left in the drawing). Also, the fourth node 38 is connected to the second node 26 to connect CS4 so that CS2 and CS4 interact in aggregate to sink current from the second node 26 such that the second current signal I2 is equal to −I (right to left in the drawing). In this second switching state, the first amplifier 12 provides a high output signal to the node 24 due to its inverting amplifier configuration, while the integrator circuit 14, C1 integrates the sinking current signal which discharges C1 to provide an upward ramp signal output waveform at node 28. The comparator 16 in this situation provides a high oscillator output voltage VOUT at the node 18 until the rising ramp signal VOTA2 exceeds the high pulse signal output on the node 24. Thus, the circuit configuration of the amplifier 12, R1, the integrator 14, C1 and the comparator 16 provides an alternating pulse signal at the node 24 as a threshold for comparison by the comparator 16 with the triangular integrator output signal at the node 28.

Figure 5:
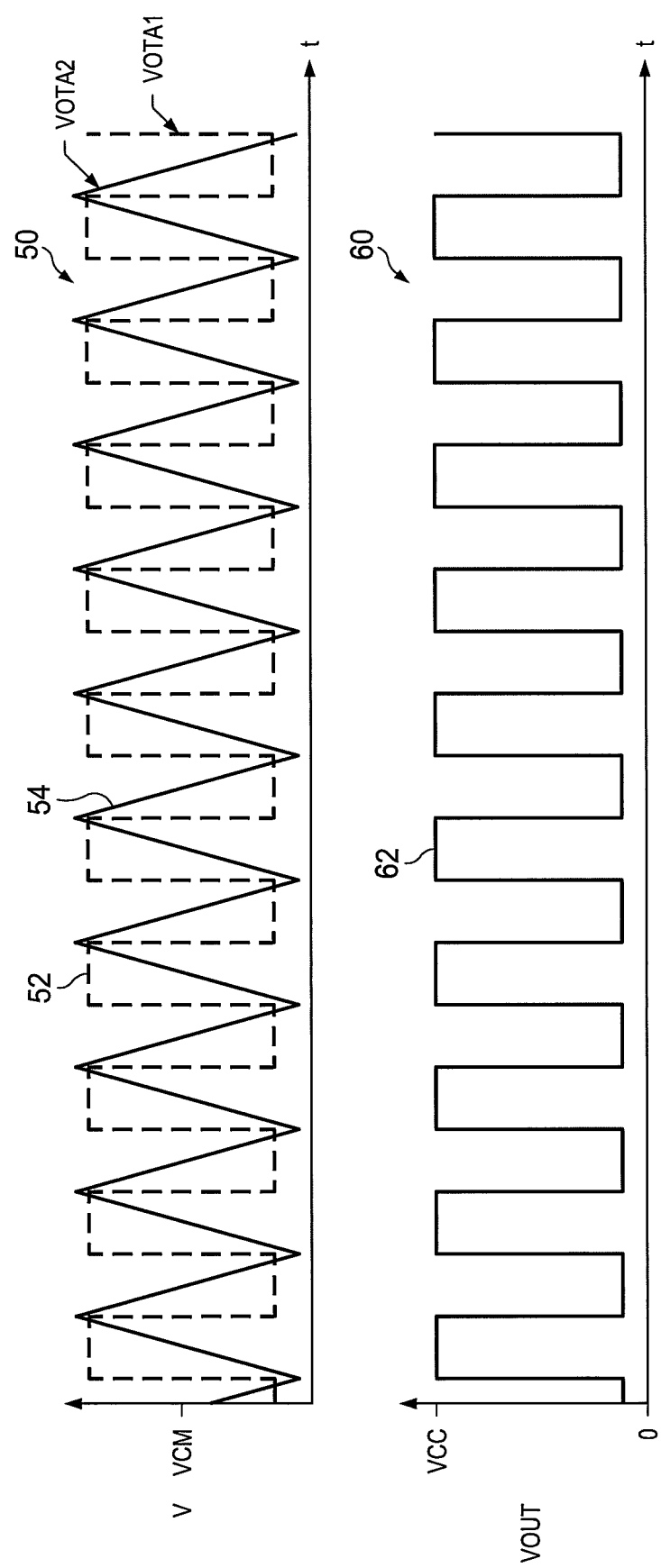
FIG. 5 is a waveform diagram illustrating alternating output waveforms of the amplifier, integrator and comparator in the oscillator circuit of FIGS. 1-4.

FIG. 5 illustrates graphs 50 and 60 in which the graph 50 illustrates the first amplifier output signal VOTA1 as waveform 52 having a generally square pulse waveform shape, as well as the integrator output waveform VOTA2 shown as a triangular waveform 54. In addition, the graph 60 illustrates the oscillator output voltage waveform 62 (VOUT) having an alternating pulse waveform shape providing the output of the oscillator circuit 10. FIG. 5 also shows one example bias voltage level VCM provided by the bias voltage source 30, in this case approximately midway between the high and low states of the first amplifier output pulse waveform 52 (VOTA1).

FIG. 6 illustrates one embodiment of the switchable current source circuit which provides matched first and second current signals I1 and I2 of alternating polarity according to the oscillator output signal VOUT using current mirror circuitry based on a single input current signal having a value I in this example from a current source CS5. The current from CS5 conducts through an NMOS transistor MN5 forming a current mirror circuit with NMOS transistors MN6, MN7, MN8 and MN9. In this case, the transistors MN8 and MN9 are twice the size of MN5 to provide the current sources CS3 and CS4 conducting generally equal currents of a value 2I respectively between the corresponding third and fourth nodes 36, 38 and the constant voltage ground node 32. The currents through MN6 and MN7 in this case, as well as MP1 have a value of "I" due to the matched sizing of these transistors with MN5. The current I is mirrored through MN7 to a low voltage cascaded current source MP2 and MP3, which is subsequently mirrored to current sources formed by MP4 and MP5, MP6 and MP7. As seen in FIG. 6, the first current source CS1 is formed by PMOS transistors MP4 and MP5, and the second current source CS2 is formed by PMOS transistors MP6 and MP7. In addition, the transistors MN1-MN4 of the switching circuit 31 are also illustrated, with the inverter 40 providing the control signals for operating MN3 and MN4 via node 42.

By this configuration, the current signals I1 and I2 are provided to the first and second circuit nodes 22 and 26, respectively, having generally equal values of alternating polarities, where the actual absolute values of these currents "I" can vary without changing the oscillator output frequency. Thus, the matching between the current sources CS1 and CS2 is set by the relative sizes of the constituent transistors in the current mirror circuitry, and the same is true of the matching of the transistors forming CS3 and CS4. Moreover, this matching is easily achieved through fabrication processing by controlling the sizes and areas of the various circuit components, and the matching will not significantly change or drift over time or temperature or power supply level. Thus, regardless of the absolute value of the current "I" provided by the input source CS5, the matching of the first and second current signals I1 and I2 will not drift over time, and thus will not cause any oscillator circuit output frequency drift. In addition, the matching of the current signals I1 and I2 is largely independent of supply voltage, whereby the oscillator output frequency has good power supply rejection and will not drift or change over time or at different supply levels. Thus, the oscillator circuit 10 presents a significant advance over the design 100 shown in FIG. 7, with significantly improved oscillator frequency stability over time.

As further shown in FIG. 6, the bias voltage supply 30 provides a common mode output signal VCM on the bias node 20 using a resistive voltage divider formed by resistors R2 and R3 connected between VCC and ground to derive the common mode bias voltage VCM from the supply voltage VCC. Connection of the bias voltage source 30 to both the non-inverting inputs of the first amplifier 12 and the integrator amplifier 14 provides unitary biasing of the OTAs 12 and 14, with the native or built-in offset voltage cancellation aspects of the design making the oscillator output frequency largely independent of the biasing voltage level VCM and of any changes in the OTA bias voltages 44, 46 and 48 of OTA1-OTA3. As a result, the circuit frequency stability is not dictated by the exact level VCM provided at the bias node 20 or offset drift effects associated with the active circuits 12, 14 and 16, and a low-cost (e.g., resistive divider) circuit 30 can be used since the circuit stability does not necessitate the use of a higher cost precision voltage source (e.g., bandgap circuit) as in the case of FIG. 7.

By using the intrinsic clock cycle of the oscillator 10, the relaxation oscillator 10 thus provides native or built-in offset voltage cancellation, and mitigates or avoids the need for an internal voltage reference to enhance its immunity with respect to degradation of the active amplifier components 12, 14 and 16 over time, and also provides immunity with respect to power supply voltage variations. By using the intrinsic charging and discharging cycle of C1, the offset voltages of the OTAs are naturally cancelled during switching operation of the oscillator without external offset cancellation using self-switching operation of the oscillator circuit without external offset cancellation clocks or circuits as detailed further below.

Both the oscillating frequency and the precision offset cancellation are determined in practice by the draw sizes of the components, to facilitate controllability as well as drift-immunity. The oscillator circuit 10 can be implemented on a commercial CMOS process and a PSRR of this circuit is expected to be 0.25%/V. In addition, the relaxation oscillator 10 is expected to have a frequency drift less than 0.5% over a 100-year operating time at body core temperature.

Referring again to FIGS. 2-5, the relaxation oscillator 10 employs OTAs 12, 14 and 16, although voltage amplifiers and comparators (e.g., op amps) can be used in other embodiments. In the illustrated embodiment, OTA1 12 is used to generate the square waveform by multiplying either current I1 or I3-I1 with the resistance of R1, and the resulting square pulse waveform 52 (FIG. 5) serves as the threshold voltage for the output comparator OTA3 16. OTA2 14 is used to generate the triangular waveform 54 for comparison to the pulse threshold by integrating a fixed current from either current source I2 or I4-I2 over the capacitance C1. The non-inverting inputs of both OTA1 and OTA2 are connected together to the common mode bias voltage generator 30 at node 20 to ensure that the OTAs 12 and 14 each have the sufficient headroom for their output swings. The current sources CS1 and CS2 as well as CS3 and CS4 are matched with each other respectively, with CS3 and CS4 individually providing twice the currents of I1 and I2.

In the first switching state of the switching circuit 31 (VOUT low in FIG. 3), I1 and I2 flow into OTA1 and OTA2, with I2 charging the capacitance C1, where the charging time Ton of each cycle is given by the following equations (2) and (3):

$$(I_2 Ton)/C_1 + VOFF2 = 2I1R1 + VOFF1 + VOFF3, \quad (2)$$

and $$Ton = C1(2I1R1 + VOFF1 + VOFF3 - VOFF2)/I2. \quad (3)$$

In the second switching circuit state (e.g., FIG. 4), I1=−I and I2=−I and these currents flow out of OTA1 and OTA2 and 12 discharges C1, where the discharging time Toff of each cycle is given by the following equations (4) and (5):

$$(((2I-I)Toff)/C1) - VOFF2 = 2(2I-I)R1 - VOFF1 - VOFF3, \quad (4)$$

and $$Toff = [2(2I-I)R1 - VOFF1 - VOFF3 + VOFF2]C1)/(2I-I). \quad (5)$$

OTA3 16 operates as a comparator which compares the triangular waveform 54 with the square wave 52 and changes the state of the switching circuit 31 accordingly. The oscillator period of the each cycle is given by the following equation (6):

$$Ton + Toff = 4R1C1, \quad (6)$$

and the oscillator frequency "f" is given by the following equation (7):

$$f = 1/(4R1C1). \quad (7)$$

As previously noted, the oscillator frequency f is primarily determined by the draw sizes of R1 and C1 and is independent of the supply voltage VCC as well as the model parameters of the active components 12, 14 and 16. The above equations (3) and (5)-(7) show the native cancellation of the OTA offset voltages 44, 46 and 48 based on the matching of the current sources CS1-CS4 through ratiometric sizing in the current mirror circuitry (e.g., FIG. 6). Since the draw sizes of the components do not change over time, this matching is therefore naturally drift-resistant. As shown in the example of FIG. 6, moreover, it is believed that a low-voltage cascode current mirror architecture may be employed in certain embodiments to achieve a less than 0.5% frequency drift over approximately 100 years operating lifetime. The initial accuracy of the oscillating frequency can be further improved by adjusting the sizes of the resistor R1 and/or capacitor C1 at the final test stage to compensate for any process variations, e.g., by fabricating one or both of R1 and/or C1 as trimmable or adjustable components or groups of components in a fabricated integrated circuit. In addition, providing OTAs having total delay times of more than approximately 5 orders of magnitude less than the clock cycle time Ton+Toff can effectively ensure that and variation of the OTA total delay time does not significantly impact the accuracy of the relaxation oscillator 10. In addition, any temperature drift can be controlled primarily by fabrication of low thermal coefficient passive components R1 and C1.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An oscillator circuit, comprising:

an amplifier circuit comprising: a first amplifier including a first input coupled with a bias node, a second input coupled with a first node, and a first amplifier output providing a first amplifier output signal; and a resistance coupled between the first node and the first amplifier output;

an integrator circuit, comprising: a second amplifier including a first input coupled with the bias node, a second input coupled with a second node, and a second amplifier output providing a second amplifier output signal; and a capacitance coupled between the second node and the second amplifier output;

a comparator comprising: a first comparator input coupled with the first amplifier output to receive the first amplifier output signal, a second comparator input coupled with the second amplifier output to receive the second amplifier output signal, and a comparator output providing an oscillator output signal alternating between a first level and a different second level;

a first current source providing a first current signal of a first current value to the first node;

a second current source providing a second current signal of the first current value to the second node;

a third current source providing a third current signal of twice the first current value from a third node to a constant voltage node;

a fourth current source providing a fourth current signal of twice the first current value from a fourth node to the constant voltage node; and a switching circuit operative according to the oscillator output signal to disconnect the third node from the first node and to disconnect the fourth node from the second node when the oscillator output signal is at the first level, and to couple the third node with the first node and to couple the fourth node with the second node when the oscillator output signal is at the second level.

2. The oscillator circuit of claim 1, wherein the first and second amplifiers are transconductance amplifiers.

3. The oscillator circuit of claim 2, wherein the comparator is a transconductance amplifier.

4. The oscillator circuit of claim 2, wherein the first and second current sources are matched to one another; and wherein the third and fourth current sources are matched to one another.

5. The oscillator circuit of claim 2, comprising:
a fifth current source providing a fifth current signal; and
a current mirror circuit including the first, second, third and fourth current sources providing the first, second, third and fourth current signals based on the fifth current signal.

6. The oscillator circuit of claim 2, comprising a bias voltage source providing a constant non-zero voltage signal to the bias node.

7. The oscillator of claim 1, wherein offset voltages of the first and second and amplifiers and an offset voltage of the comparator are naturally cancelled out during switching operation of the oscillator without external offset cancellation.

8. The oscillator circuit of claim 7, wherein the offset cancellation uses the self-switching operation of the oscillator circuit without external offset cancellation clocks or circuits.

9. The oscillator circuit of claim 1, wherein the first and second current sources are matched to one another; and wherein the third and fourth current sources are matched to one another.

10. The oscillator circuit of claim 9, comprising:
a fifth current source providing a fifth current signal; and
a current mirror circuit including the first, second, third and fourth current sources providing the first, second, third and fourth current signals based on the fifth current signal.

11. The oscillator circuit of claim 9, comprising a bias voltage source providing a constant non-zero voltage signal to the bias node.

12. The oscillator circuit of claim 1, comprising:
a fifth current source providing a fifth current signal; and
a current mirror circuit including the first, second, third and fourth current sources providing the first, second, third and fourth current signals based on the fifth current signal.

13. The oscillator circuit of claim 1, comprising a bias voltage source providing a constant non-zero voltage signal to the bias node.

14. A relaxation oscillator, comprising:
a current mirror circuit providing: a first current of a first current value to a first node, a second current of the first current value to a second node, a third current of twice the first current value from a third node to a constant voltage node, and a fourth current of twice the first current value from a fourth node to the constant voltage node;
a switching circuit operative in a first state to disconnect the third node from the first node and to disconnect the fourth node from the second node to individually provide positive first and second current signals of the first current value to the first and second nodes, respectively, the switching circuit operative in a second state to couple the third node with the first node and to couple the fourth node with the second node to individually provide negative first and second current signals of the first current value to the first and second nodes, respectively;
a first amplifier circuit receiving and amplifying the first current signal from the first node to provide a first output signal as a pulse waveform having alternating first and second levels;
a second amplifier circuit receiving and integrating the second current signal from the second node to provide a second output signal as a ramp waveform having alternating negative and positive slopes; and
a comparator comparing the first and second output signals to provide an oscillating comparator output signal to alternatively place the switching circuit in the first state when the oscillator output signal is at a first level or in the second state when the oscillator output signal is at a different second level.

15. The relaxation oscillator of claim 14:
wherein the first amplifier circuit comprises:
a first transconductance amplifier including a first input coupled with a non-zero bias voltage, a second input coupled with the first node, and a first amplifier output providing the first output signal, and
a resistance coupled between the first node and the first amplifier output; and
wherein the second amplifier circuit comprises:
a second transconductance amplifier including a first input coupled with the bias voltage, a second input coupled with the second node, and a second amplifier output providing the second output signal, and
a capacitance coupled between the second node and the second amplifier output.

16. The relaxation oscillator of claim 14, comprising a current source providing an input current signal to the current mirror circuit, wherein the current mirror circuit provides the first, second, third and fourth currents based on the input current signal.

17. The relaxation oscillator of claim 14, wherein the comparator comprises a third transconductance amplifier including: a first comparator input receiving the first amplifier output signal, a second comparator input receiving the second amplifier output signal, and a comparator output providing the comparator output signal.

18. An oscillator, comprising:
a first amplifier including a first input coupled with a bias node, a second input coupled with a first node, and a first amplifier output providing a first output signal; and
a resistance coupled between the first node and the first amplifier output;
a second amplifier including a first input coupled with the bias node, a second input coupled with a second node, and a second amplifier output providing a second output signal;
a capacitance coupled between the second node and the second amplifier output;
a switchable current source circuit operative in a first state to source a positive first current signal of a first current value to the first node and to source a positive second current signal of the first current value to the second node, the switchable current source circuit operative in a second state to sink a negative first current signal of the first current value from the first node and to sink a negative second current signal of the first current value from the second node; and
an output circuit providing an oscillator output signal at a first level to place the switchable current source circuit in the first state when the second output signal exceeds the first output signal, the output circuit providing the oscillator output signal at a second level to place the switchable current source circuit in the second state when the first output signal exceeds the second output signal.

19. The oscillator of claim 18, comprising a bias voltage source providing a constant non-zero voltage signal to the bias node.

20. The oscillator of claim 18, wherein the first and second amplifiers are transconductance amplifiers.

* * * * *